United States Patent [19]
Vakhshoori et al.

[11] Patent Number: 5,328,854
[45] Date of Patent: Jul. 12, 1994

[54] FABRICATION OF ELECTRONIC DEVICES WITH AN INTERNAL WINDOW

[75] Inventors: Daryoosh Vakhshoori, Scotch Plains; James D. Wynn, Plainfield; George J. Zydzik, Columbia, all of N.J.

[73] Assignee: AT&T Bell Laboratories, Murray Hill, N.J.

[21] Appl. No.: 40,797

[22] Filed: Mar. 31, 1993

[51] Int. Cl.⁵ .......................................... H01L 21/265
[52] U.S. Cl. ....................... 437/24; 437/128; 437/228; 437/229; 437/35; 437/947; 437/981; 156/661.1
[58] Field of Search ............... 437/24, 129, 228, 931, 437/947, 981, 35, 229; 148/DIG. 106, DIG. 161; 156/644, 661.1

[56] References Cited

U.S. PATENT DOCUMENTS 3,908,262  9/1975  Stein ....................................... 437/35
5,185,290  2/1993  Aoyagi et al. ....................... 437/128

FOREIGN PATENT DOCUMENTS 0084924  4/1991  Japan ..................................... 437/35

OTHER PUBLICATIONS

Colden et al. "Directional reactive ion etching of InP with Cl₂ containing gases" Journal Vacuum Sci. Tech 19(2), Jul/Aug. 1981, pp. 225–230.
G. Hasnain et al. "High Temperature and High Frequency..." *Electronics Letters,* vol. 27, No. 11, May 23, 1991, pp. 915–916.
G. Hasnain, et al., "Performance of Gain-Guided Surface..." *IEEE Jrnl. Quantum Elec.,* vol. 27, No. 6, Jun. 1991, pp. 1377–1385.
T. Takamori et al., "Angled etching of GaAs/AlGaAs by conventional Cl₂ reactive ion etching", *Appl. Phys. Lett.,* 53 (25), 19 Dec. 1988, pp. 2549–2551.

*Primary Examiner*—Olik Chaudhuri
*Assistant Examiner*—Ramamohan Rao Paladugu
*Attorney, Agent, or Firm*—Oleg E. Alber

[57] ABSTRACT

A process is described of producing devices, such as vertical cavity surface emitting lasers or resonant cavity light emitting devices, with an insulating region between an active region and top electrode, the insulating region having a centrally located window permitting passage of the electric current from the top electrode to the bottom electrode centrally of the active region. The insulating region is formed by ion implantation. The window is defined by a photoresist mask formed by angle etching a photoresist masking layer by RIE, so as to form the mask with parallel side walls inclined at an angle to the normal to the masked surface. The ion implantation is conducted at the same angle and parallel to the side walls of the of the mask. This permits fabrication of devices individually or in arrays. An exemplary independently addressable top emitting 8×18 VCSEL array (VCSELA) with GaAs multi-quantum well gain region was fabricated with excellent properties using the angle etched masks. The typical threshold current and voltage of the exemplary devices in this array are approximately 4 mA and 2.65 V respectively. The L-I-V characteristics of the devices do not change by current annealing. Also, a comparison between devices produced by using the novel angled implantation mask and devices produced by using conventional lithography implantation mask indicates the importance of the implantation mask preparation on the final VCSEL operating characteristics.

11 Claims, 4 Drawing Sheets

FABRICATION OF ELECTRONIC DEVICES WITH AN INTERNAL WINDOW

FIELD OF THE INVENTION

This invention concerns manufacture of electronic devices having an internal window and the so-produced devices.

BACKGROUND OF THE INVENTION

Two dimensional arrays of such electronic devices as Vertical Cavity Surface Emitting lasers (VCSELs) or Light Emitting Diodes (LEDs), have numerous applications in high capacity switching systems, back-plane computer interconnect technology, smart pixel arrays, high power coherent beam generation, and two dimensional beam steering. The elements of these arrays can either work in unison to generate coherent supermodes or operate independently as high density sources for multi-channel systems. In the manufacture of such electronic devices, an area of semiconductor layers, such as distributed Bragg reflector mirror and/or confining layer, above an active (radiation emitting) region is peripherally implanted with dopant (proton) ions while leaving the central area of those layers unaffected. These peripheral areas become impenetrable to electric current restricting its passage to the central area of the active region. In this manner the electric current flow from a top electrode to a bottom electrode of the device is directed through the central area of the active layer defined by the so-formed window, while the optical radiation is emitted through the window and then through the aperture in the top electrode. Examples of VCSELs are disclosed in articles by G. Hasnain et al., "High Temperature and High Frequency Performance of Gain-Guided Surface Emitting Laser," *Electronics Letters* Vol. 27, No. 11, May 23, 1991, pp. 915–16, and G. Hasnain et al., "Performance of Gain-Guided Surface Emitting Lasers with Semiconductor Distributed Bragg Reflectors", *IEEE Journal of Quantum Electronics*, Vol. 27, No. 6, June 1991, pp. 1377–85.

Applicants have discovered that conventional photoresist processing of masks for ion implantation and subsequent implantation of proton ions through the masks leads to improperly defined windows, wherein the walls of the windows have unsharply defined, fuzzy implantation damage outlines resulting in higher device resistance. This leads to higher threshold values of the device, which leads to lower operating characteristics of the device. Thus, it is desirable to produce implantation damage profile which more precisely defines the window in the ion-damaged area.

Summary of the Invention

This invention embodies a process of producing devices, such as vertical cavity surface emitting lasers or resonant cavity light emitting devices, with an insulating region between an active region and top electrode, the insulating region having a centrally located window permitting passage of the electric current from the top electrode to the bottom electrode centrally of the active region. The insulating region is formed by ion implantation. The window is defined by a photoresist mask formed by angle etching a photoresist masking layer by RIE, so as to form the mask with parallel side walls inclined at an angle to the normal to the masked surface. The ion implantation is conducted at the same angle and parallel to the side walls of the of the mask. This permits fabrication of devices individually or in arrays. An exemplary independently addressable top emitting 8×18 VCSEL array (VCSELA) with GaAs multi-quantum well gain region was fabricated with excellent properties using the angle etched masks. The L-I-V characteristics of the devices do not change by current annealing. Also, a comparison between devices produced by using the novel angled implantation mask and devices produced by using conventional lithography implantation mask indicates the importance of the implantation mask preparation on the final VCSEL operating characteristics.

DETAILED DESCRIPTION

Figure 1:
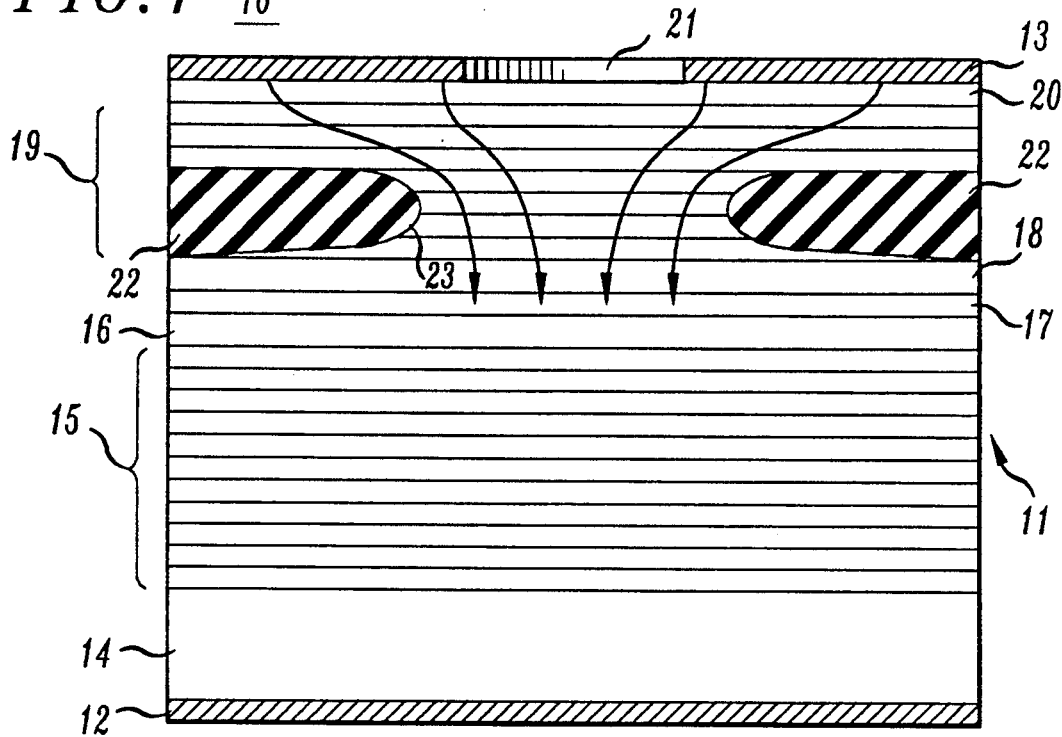
FIG. 1 is a schematic representation of a VCSEL with an internal window.

Shown in FIG. 1 is an embodiment of an exemplary VCSEL device, generally identified by numeral 10. For illustration purposes, dimensions of the device are not drawn to scale. The device includes a semiconductor structure, generally identified by numeral 11, and a bottom electrode, 12, and a top electrode, 13, to the semiconductor structure.

Semiconductor structure 11 of a VCSEL typically includes, in an ascending order from bottom electrode 12, a substrate, 14, a distributed Bragg reflector (DBR) bottom mirror, 15, a bottom confining layer, 16, an active region, 17, a top confining layer, 18, a DBR top mirror, 19, and a high conductivity contact layer, 20, positioned between the top DBR mirror and the top electrode enabling non-alloyed, ohmic contact to the top electrode. While not shown, the structure may include a buffer layer or layers positioned between the substrate and the bottom DBR.

In the exemplary embodiment of the VCSEL, top electrode 13 is provided with centrally located aperture, 21, which permits emission of radiation through a relatively small area. Also shown above active region 17 is an insulating region, 22, having a window, 23. The latter is coaxially aligned with aperture 21. Aperture 21 and window 23 range from to 5 to 50 μm in diameter, preferably from 10 to 20 μm in diameter. The insulating region restricts the passage of current from the top electrode to the bottom electrode to the central portion of the active layer defined by window 23.

The exemplary semiconductor structure was grown by molecular beam epitaxy (MBE). In the exemplary embodiment, the Varian Gen II ® system was calibrated to grow material designed for the cavity mode centered around 850 nm. Active region 17 consisted of 5 GaAs quantum wells each 70 Å thick surrounded by $Al_{0.16}Ga_{0.84}As$ cladding layers 16 and 18. Top and bottom mirrors 19 and 15, which are doped with p-type and n-type conductivity dopants, respectively, are one step distributed Bragg reflectors with 20 and 28 periods, respectively, of AlAs (604 Å)/$Al_{0.58}Ga_{0.42}As$ (99 Å)/$Al_{0.16}Ga_{0.84}As$ (515 Å) with high doping at the interface. The donor doping profile in the top mirror was designed to reduce the free carrier loss. A thin heavily doped GaAs contact layer 20 is used in a thickness sufficient to establish a non-alloyed ohmic contact between the metal electrode and the DBR mirror without affecting transmission of laser light there through. A GaAs thickness of 44 Å is sufficient to preserve planarity of the process while avoiding laser light absorption by the contact layer. The top mirror power reflectivity was designed to be 99.5 percent with 0.23 percent free carrier loss and 0.24 percent power transmission. The reflectivity of the bottom mirror was designed to be 99.88 percent.

Figure 2:
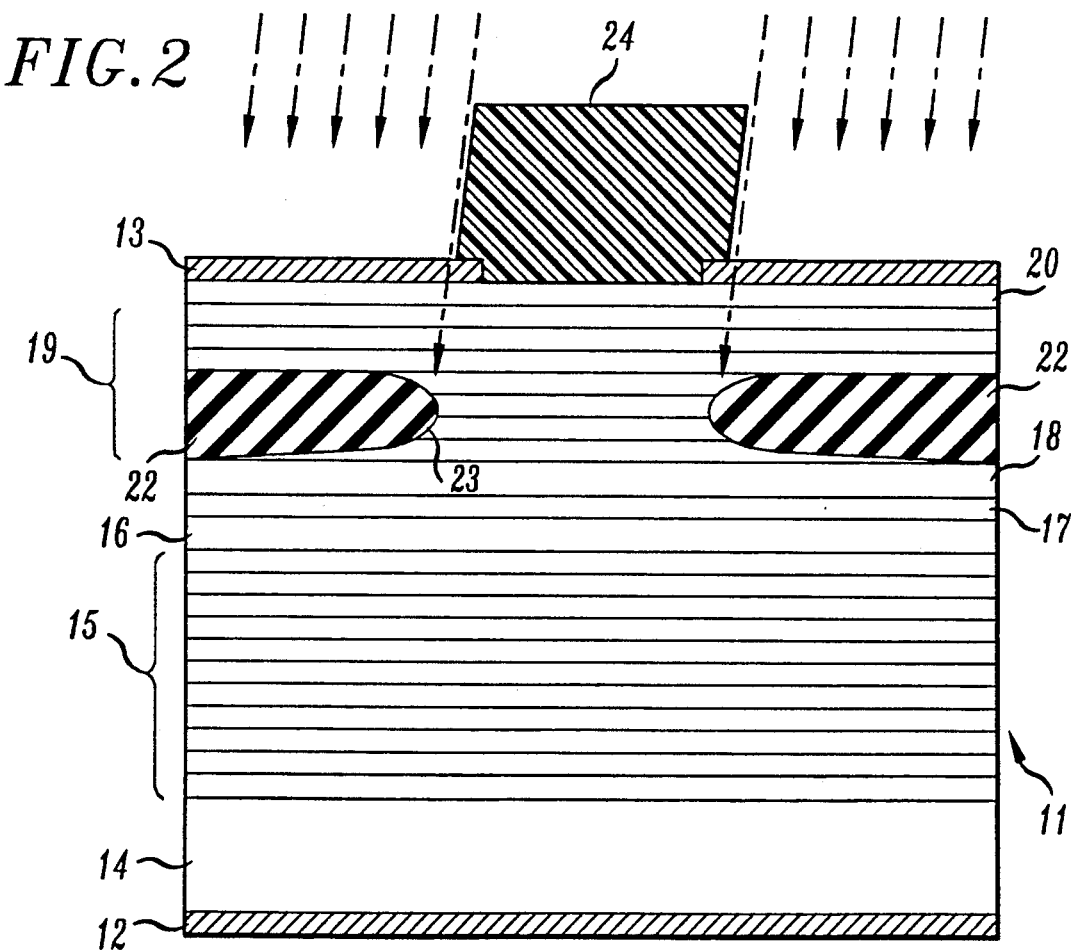
FIG. 2 is a schematic representation of the VCSEL structure shown with an angled implantation mask and a window in the implanted area.

Windows were fabricated using an implantation process schematically represented in FIG. 2. The dopant (proton) ions were implanted into the semiconductor structure through the top metal electrode at an angle to the normal to the top surface of the top electrode and parallel to the side walls of mask dots 24 on the top electrode. These ions are selected from ions of elements which do not affect the conductivity type of the material in which they are implanted, but increase the resistivity of the implanted regions causing the implanted regions to become insulating with respect to the passage of the current through these regions. Ions, such as $H^+$, $O^+$, or $F^+$ are implanted in concentrations of from $1 \times 10^{13}$ to $\times 5 \times 10^{14}$ per $cm^2$.

A photoresist implantation mask, 24, is prepared by angled reactive ion etching. The parallel side-walls of the so-prepared implantation mask have an angle with respect to the surface normal, which angle is parallel to the proton implantation beam. This results in laterally abrupt implantation damage above the active region creating a sharply defined window in a proton implanted damaged area.

The fabrication process is as follows. Semiconductor structure 11 is formed upon substrate 14 by MBE process which is well known. Top electrode 13 is formed by evaporating a metallic layer, such as Ti/AuBe/Au, on top of the GaAs contact layer 20 and patterning the metallic layer by lift-off technique defining the top electrode of the device and forming circular aperture 21. In cases where more than one device is formed, apertures 21 are spaced, for example, 500 μm apart, each from another.

Next the ion implantation mask is fabricated. First the surface of the top electrode and areas of GaAs contact layer 20 exposed in aperture 21 is covered by a 3000 Å thick protective layer of $SiO_2$ (not shown) deposited by plasma enhanced chemical vapor deposition (PECVD). This thickness corresponds approximately to $\lambda/2$ of $SiO_2$ so that the layer does not significantly alter the top mirror reflectivity while providing protection against subsequent deposition, baking and removal of a masking photoresist layer. The wafer with the protective $SiO_2$ layer is covered with 6 μm of 4620 AZ TM masking photoresist and baked for 6–8 hours at 150° C. The wafer is then coated with 3000 Å thick layer of spin-on-glass followed by deposition of a thin photoresist layer (1.5 μm of Shipley 1450J TM) on top of the spin-on-glass. To harden the spin-on-glass to withstand the future photoresist development step, the wafer is baked at 250° C. for half an hour prior to the deposition of the thin photoresist layer. In the specific example the thin photoresist layer is patterned by conventional lithography into dots on top of the spin-on-glass in the form of an implantation mask. In the exemplary devices, aperture 21 is 12 μm in diameter, and the dots are made larger than the apertures, e.g., 15 μm in diameter. Since the spin-on-glass layer is transparent, the dots can be aligned directly with the 12 μm aperture in the metal electrode layer. The thin photoresist pattern is transferred first to the spin-on-glass layer by $CF_4/O_2$ plasma and then to the bottom photoresist layer using Oxygen reactive ion etching (RIE).

The transfer of the dot pattern to the thick photoresist layer on the patterned wafer is conducted by an angle etching technique. The wafer is mounted on a wedge placed on the bottom electrode plate of a parallel plate reactive ion etching (RIE) oxygen system equipped with turbo-molecular pump. This alignment assures that the walls of the implantation mask dots will be etched at an angle to a normal to the top of the metal surface of the top electrode. In the specific example this angle is 7°, but may range from 5° to 10°. In this manner, the side walls of resultant dots, 24, of the photoresist will be inclined with respect to the metal surface of the top electrode, as is shown in FIG. 2. Running a discharge at 0.4 Pa insures that the thickness of the Faraday dark region is much larger than the height of the wafer that extends above the plate. In this way, the boundary of the dark region will remain almost parallel to the cathode plate of the RIE system and hence the ions will accelerate in a trajectory perpendicular to the plate.

Figure 7:
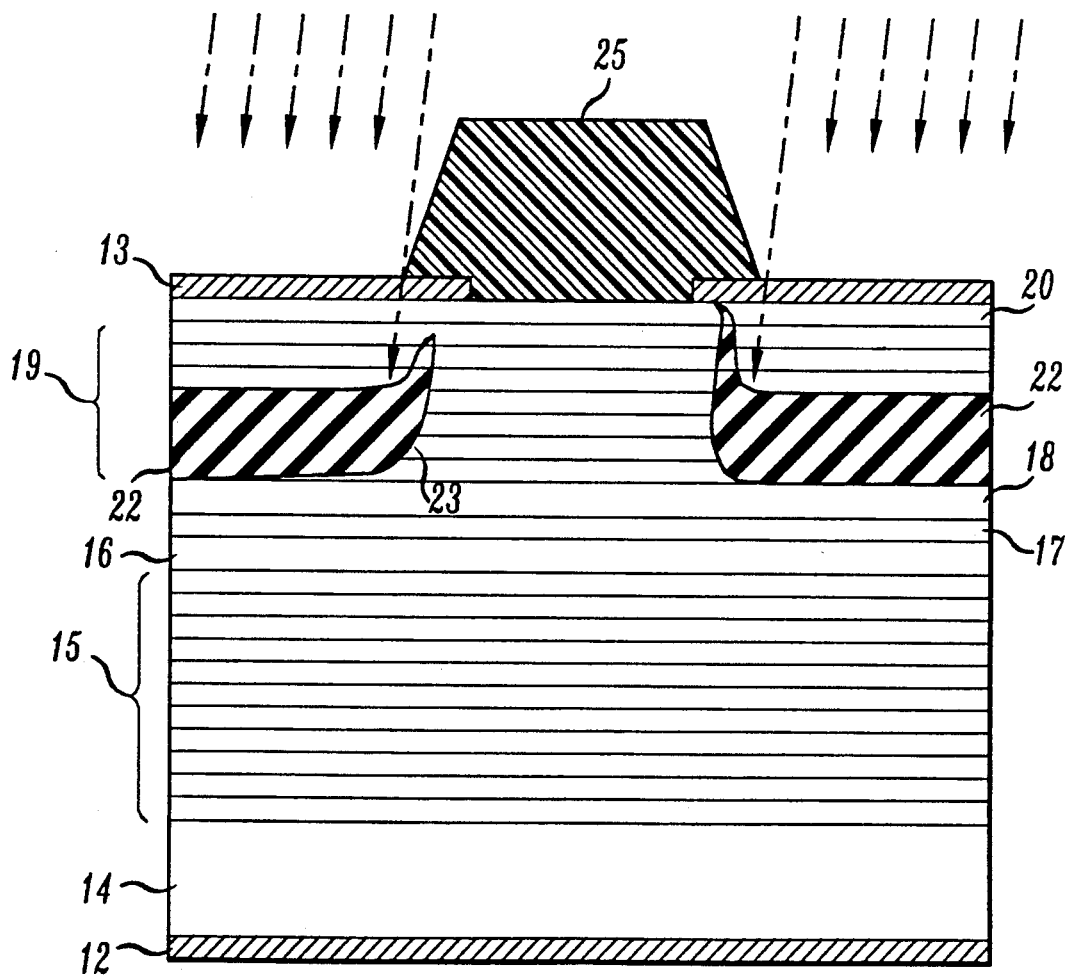
FIG. 7 shows a schematic representation of a VCSEL structure with a conventionally etched implantation mask and resultant imperfect window in the implanted area.

The implantation of ions (e.g. $H^+$, $O^+$ or $F^+$) into the peripheral region of at least the top DBR mirror is conducted next. The angle at which ion implantation takes place is aligned with that of the RIE angled etch side wall of mask 24. By implanting the ions at an angle parallel to the side walls of the mask, the ends of areas damaged by the implanted ions have sharply defined boundaries as shown in FIG. 2. In contrast, windows produced by ion implantation using masks produced by conventional, non-angled procedures tend to have unsharply defined, diffuse, fuzzy implantation damage outlines of the window, as is represented in FIG. 7. After the implantation, the substrate is thinned to about 100 μm, and AuGe/Ni/Au is evaporated on the bottom of the substrate forming bottom electrode 12. The ohmic contacts, and especially the ohmic contact between the top electrode and the GaAs contact layer 20, are not alloyed.

Figure 3:
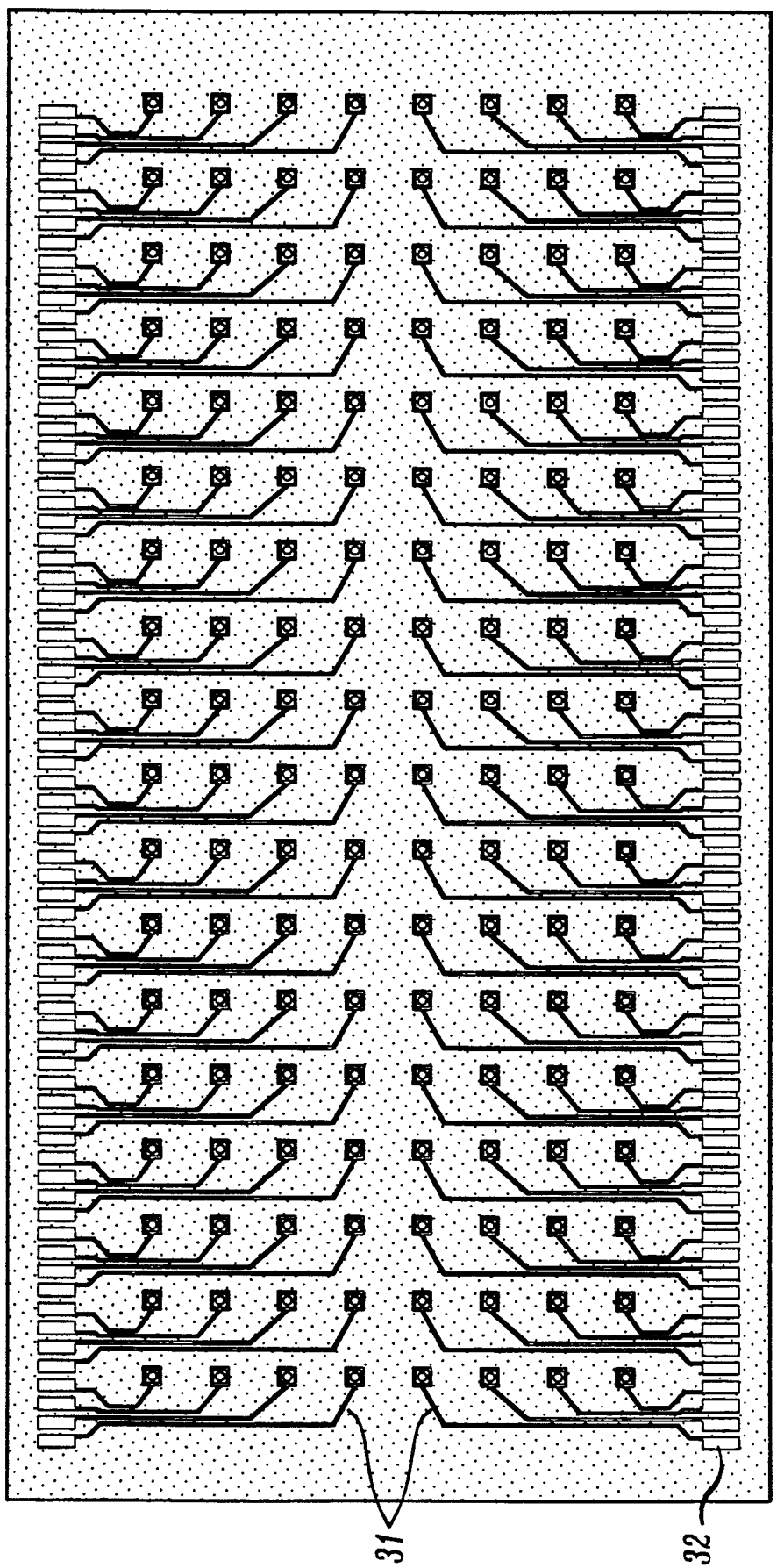
FIG. 3 is a schematic representation of a top view of a 8×18 VCSEL array (VCSELA)

After the ion implantation the devices may be separated into individual devices or into arrays of the devices addressable individually or in any desired combination of devices. In the latter case, contact areas are opened in the protective $SiO_2$ layer around portions of the 12 μm laser aperture and electrical runners, 31, are defined connecting each device 10 to a contact pad, 32, at the edge of a chip. The runners may be defined in the metal layer remaining after the lift-off step when patterning the top electrode and its windows. Alternatively the runners may be deposited by evaporating the runners onto the $SiO_2$ layer. A schematic representation of an exemplary VCSELA of 8×18 individually addressable VCSELs on a 4 mm×9 mm chip is shown in FIG. 3. Each array has 144 contact pads around the periphery.

Figure 4:
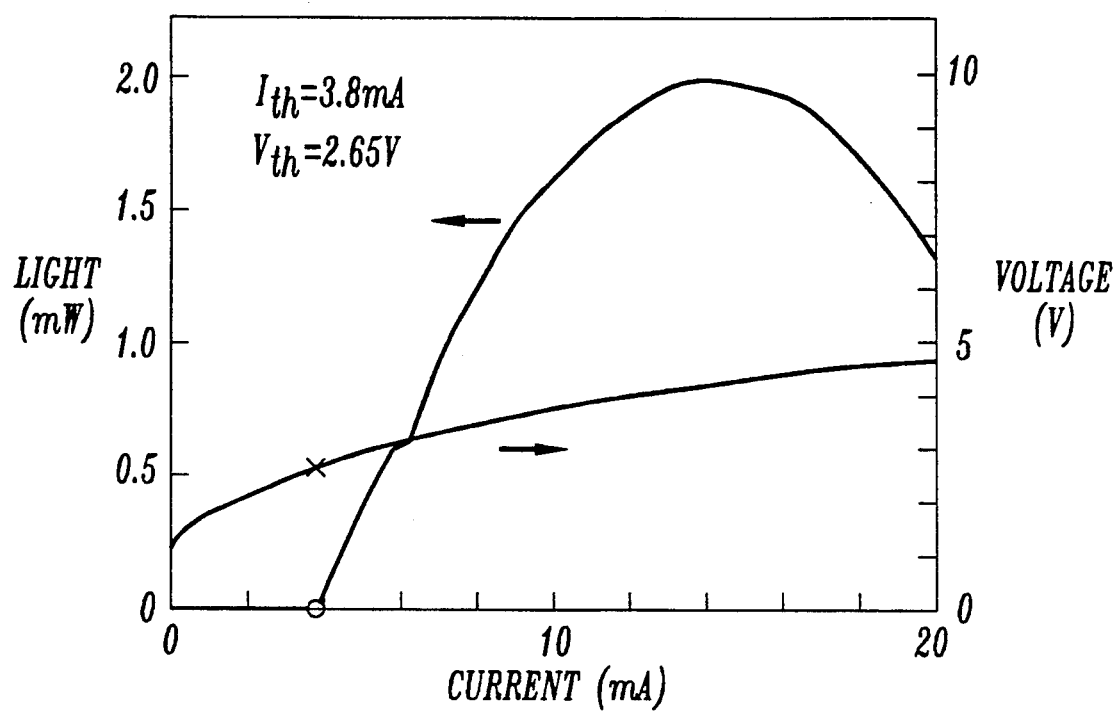
FIG. 4 is a plot of current-light-voltage characteristics of a typical element of a VCSELA.

The light-current-voltage (L-I-V) characteristics of an individual VCSEL of the array is presented in FIG. 4. The threshold current of each individual element is 3.8 mA, and the corresponding voltage is 2.65 V. The peak output power is ≈2.1 mW. The threshold current and voltage is relatively uniform across the array. No significant current annealing phenomena has been observed. The array performance is quite robust, unaffected by previous operating conditions. Ramping the current from 0.0 mA to 35 mA successively, leads to only 0.1 V change in threshold voltage. The array performance is, in general, unaffected by previous operating conditions. This insensitivity to current annealing is essential for realization of large arrays.

Figure 5:
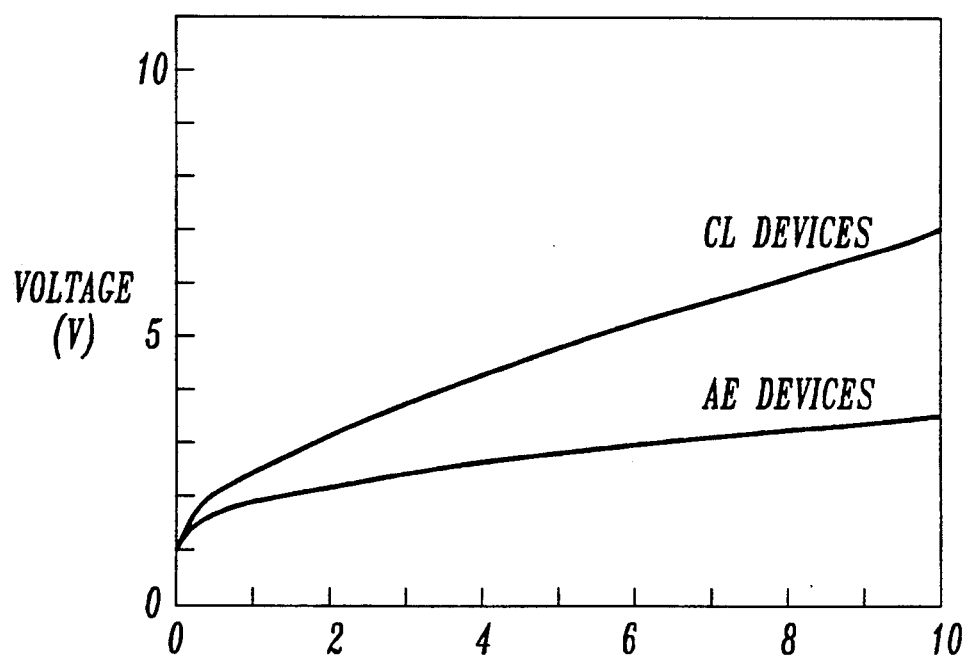
FIG. 5 is a representation of comparative plots of typical current-voltage characteristics of two devices of the VCSELA prepared either by angle etching (AE devices) or by conventional lithography (CL devices)
Figure 6:
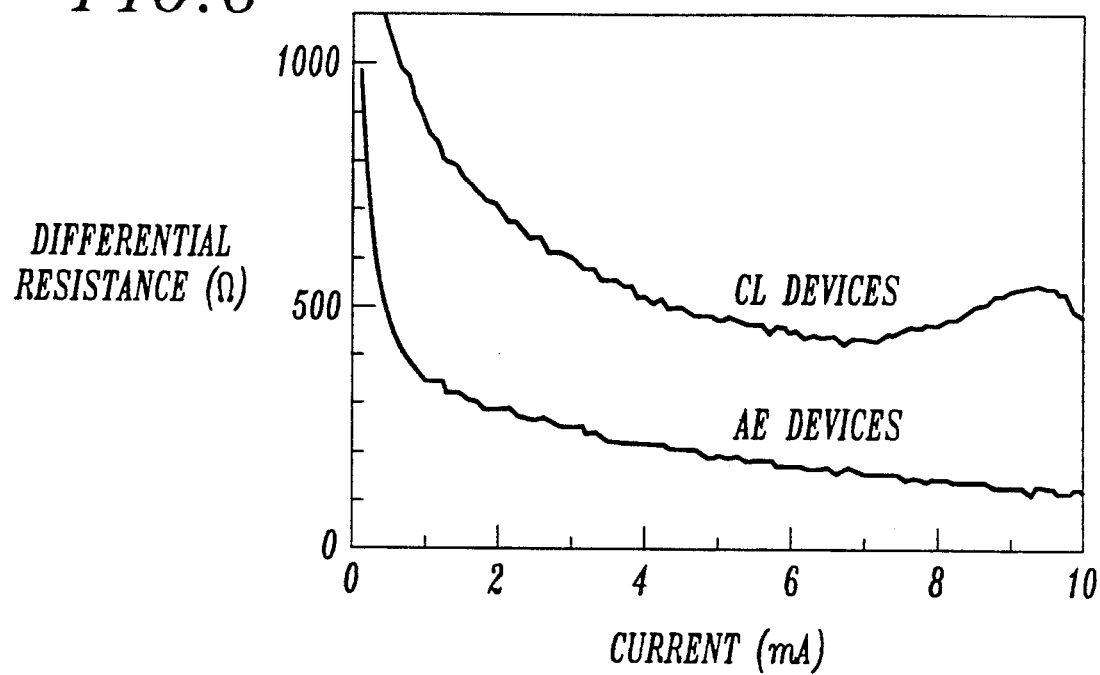
FIG. 6 is a representation of comparative plots of the differential resistance values of the AE devices and the CL devices.

To demonstrate the significance of the effects of the angle etched (AE) implantation mask on device performance, a comparison was made between devices produced by the use of the angle etched implantation mask and the conventional lithography (CL). The angle etched implantation mask of FIG. 2 was prepared as described above to fabricate devices referred to as AE devices, while conventional lithography was used resulting in photoresist masking dots, 25, shown in FIG. 7, 15 μm in diameter and 6 μm thick to fabricate devices, referred to as CL devices. Both samples were obtained from nearby pieces of the same wafer. Less than 5 percent variation in the I-V device characteristics was observed if AE process is used. As can be seen in FIG. 5, the AE devices drop about 1.7 V less than CL devices at 4 mA. Furthermore, in contrast to the AE devices, the CL devices are current annealable: the voltage decreases from 4.3 V to 3.5 V after several current sweeps from 0 to 35 mA. The current annealing leads to an increased resistance of the device. As is seen from FIG. 6, the differential resistance values of the AE devices are noticeably lower than those of the CL devices. The difference between the two techniques is that in cross-section the AE implantation mask is a parallelepiped with sides parallel to the proton ion trajectory, while in the other case, the CL mask is trapezoidal with ≈70° sloping walls. The two different techniques result in two different implantation damage profiles just under the sloping sides at the periphery of the 15 μm photoresist dot. The observed difference in the I-V characteristics presumably result from this difference.

The above-described process is also applicable to the production of the Resonant Cavity LEDs with an internal window. There could be some differences in the construction of the VCSELs and RCLEDs, such as the use of only one mirror. Nevertheless, the process described with reference to the production of windows in the VCSELs would be applicable to the production of the RCLEDs.

The process would also be applicable to the production of windows with implantation masks having openings in the photoresist mask rather than dots of the photoresist. Walls of the openings, sloping in opposite, nonparallel directions, would also result in extended, poorly defined implanted areas. Use of angled walls of the opening, with wall sloping in parallel each to another, would lead to sharply defined ends of the ion implanted areas.

Additional advantages and modifications will readily occur to those skilled in the art. Therefore, the invention in its broader aspects is not limited to the specific details, representative devices, and illustrated examples shown and described. Accordingly, various modifications may be made without departing from the spirit or scope of the general inventive concept as defined by the appended claims and their equivalents.

We claim:

1. A method of manufacturing electronic devices having internal windows in an insulating, ion implanted region, the device including a semiconductor structure and a top and a bottom metal electrode to the structure, which comprises:

depositing on the top surface of the top electrode a photoresist layer in a thickness sufficient to prevent implantation ions from reaching semiconductor material underlying the top electrode, patterning the photoresist layer, and implanting proton ions into said semiconductor material, forming an insulating region with a centrally located window, wherein said photoresist layer is patterned by angle etching with reactive ion etching (RIE) to produce a masking pattern side walls of which are inclined a preselected angle with respect to a normal to said top surface and which are parallel each to another, and said implanting of the ions is conducted at an angle directed parallel to the side walls of the photoresist pattern.

2. The method of claim 1, in which said photoresist layer is patterned in the form of dots of photoresist, having side walls parallel each to another and sloping said angle relative to a plane normal to the plane of the top surface of the top electrode.

3. The method of claim 1, in which said photoresist mask is produced by depositing a thick photoresist layer on top of the metal electrode, depositing a spin-on-glass layer on top of the photoresist layer, depositing a thin photoresist layer on top of the spin-on-glass layer, patterning the thin photoresist layer by conventional lithography into a desired pattern, and transferring said pattern to the spin-on-glass layer by etching in a $CF_4/O_2$ plasma and then to the thick photoresist layer by Oxygen Reactive Ion Etching (RIE).

4. The method of claim 2, in which, prior to said RIE step, the top surface of the device is arranged at an angle relative to a normal to parallel plates of a RIE oxygen system, said angle corresponding with an angle of implantation at a subsequent ion implantation step.

5. The method of claim 1, in which said angle is within a range of from 5 to 10 degrees relative to the normal to said top surface.

6. The method of claim 5, in which said angle is 7 degrees.

7. The method of claim 3, in which said metal electrode has an aperture for the passage of radiation emission therethrough, and in which, prior to the deposition of the thick photoresist layer, an $SiO_2$ layer approximately $\lambda/2$ thick is deposited on top of the metal electrode and on a surface of the semiconductor structure exposed in the aperture.

8. The method of claim 7, in which said exposed surface is a surface of a semiconductor contact layer.

9. The method of claim 1, in which said device is selected from vertical cavity surface emitting lasers (VCSELs) and from resonant cavity light emitting diodes (RCLEDs).

10. The method of claim 1, in which said device is a VCSEL, the semiconductor structure of which includes multi-quantum wells, active top and bottom confining layers, and DBR top and bottom mirrors, and said insulating region is formed by said implantation of ions into peripheral areas of the top DBR mirror.

11. The method of claim 10, in which a plurality of these VCSELs is arranged into an array of individually addressable VCSELs.

* * * * *